US005229545A

United States Patent [19]

Good

[11] Patent Number: 5,229,545

[45] Date of Patent: Jul. 20, 1993

[54] SWITCH HOLDER FOR ALARM SYSTEMS

[76] Inventor: Gregory G. Good, 14920 16th Ave. SE., Mill Creek, Wash. 98012

[21] Appl. No.: 954,904

[22] Filed: Sep. 30, 1992

[51] Int. Cl.[5] ........................ H05K 5/00; H01H 13/04

[52] U.S. Cl. .................................. 174/52.1; 361/357; 200/293

[58] Field of Search ................. 174/50, 52.1; 361/356, 361/357, 376, 390; 200/293, 293.1, 294, 295, 296, 297

[56] References Cited

U.S. PATENT DOCUMENTS

| | | | |
|---|---|---|---|
| 2,307,258 | 1/1943 | De Smidt et al. | 200/159 |
| 2,897,327 | 7/1959 | De Smidt et al. | 200/168 |
| 3,200,227 | 8/1965 | Karch | 200/293 |
| 3,453,408 | 7/1969 | Mune | 200/168 |
| 3,597,564 | 8/1971 | Lewis | 200/168 |
| 3,723,689 | 3/1973 | Wenzel | 200/166 |
| 3,953,699 | 4/1976 | Scheibel et al. . | |
| 4,051,665 | 10/1977 | Arn | 200/293 |
| 4,163,882 | 8/1979 | Baslow . | |
| 4,977,300 | 12/1990 | Schroeder | 200/293 |
| 5,128,828 | 7/1992 | Mrenna et al. | 361/346 |

FOREIGN PATENT DOCUMENTS

| | | | |
|---|---|---|---|
| 2201825 | 8/1990 | Japan | 200/293 |

*Primary Examiner*—Leo P. Picard
*Assistant Examiner*—Bot L. Ledynh

[57] ABSTRACT

A switch holder includes a cover which slidingly receives a push-button type switch at opposite ends. The cover is adapted to provide a mounting for the switches such that the switches are conveniently slid into and out of the cover. A base is provided which includes a surface having a raised portion to aid in mounting the cover. The base also includes abutment members which contact the switch when the cover is mounted thereby positioning and steadying the switches within the cover. The cover has mounting tabs which engage small openings in the base in a flexure and snap in place type of connection. The cover may also be attached to the base by passing fasteners through holes in the cover which align with mounting holes in the base.

15 Claims, 2 Drawing Sheets

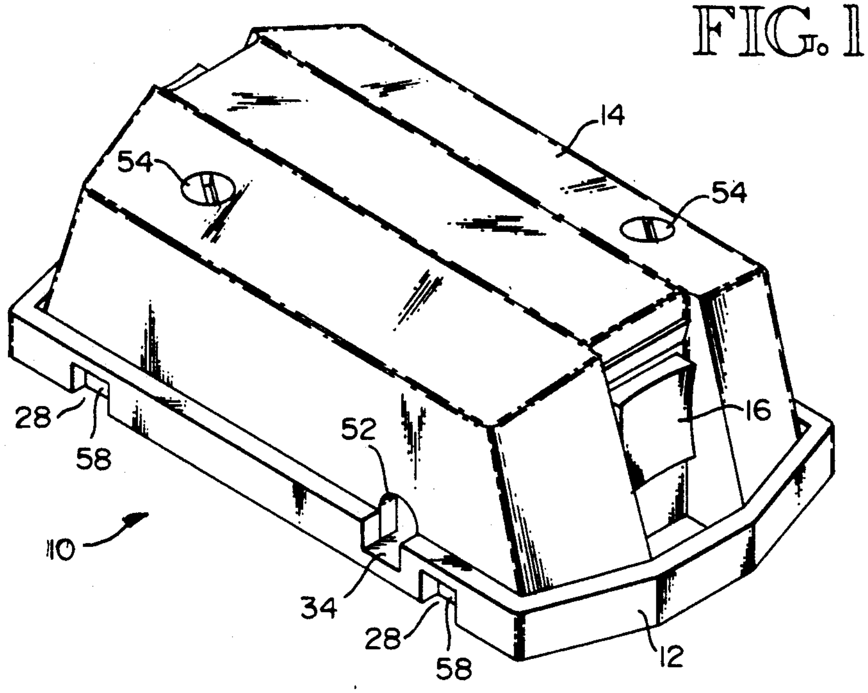
FIG. 1
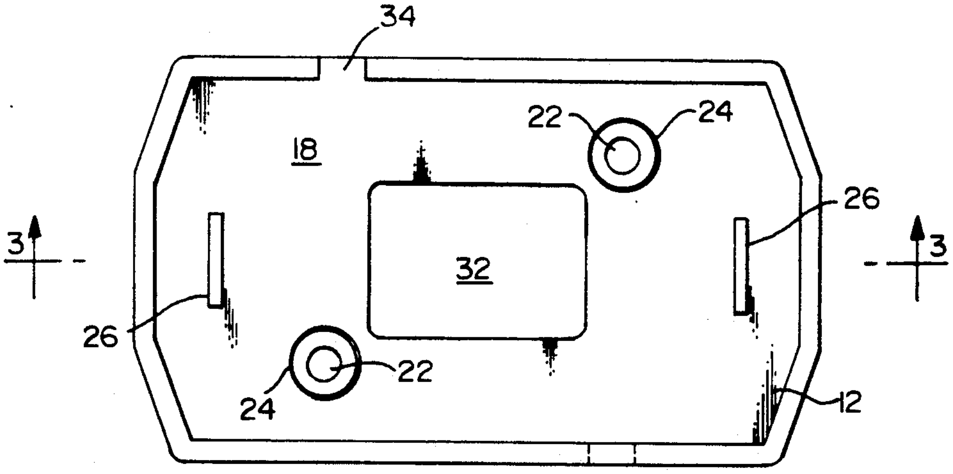
FIG. 2
FIG. 3
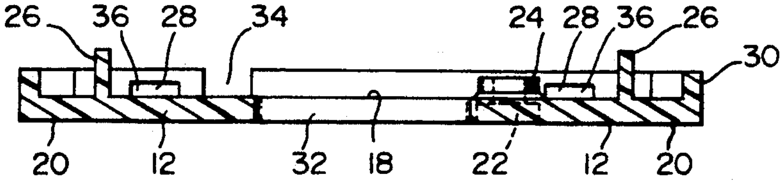

FIG. 4
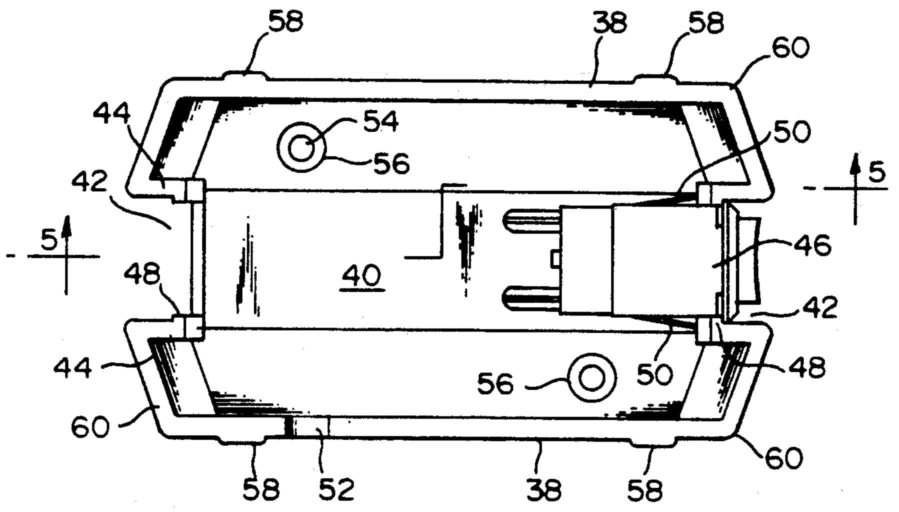
FIG. 5
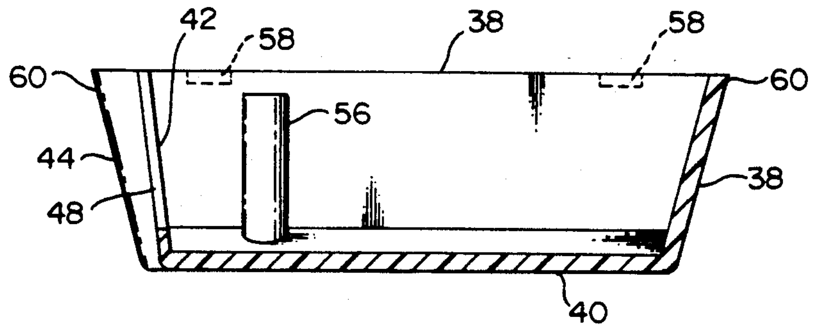
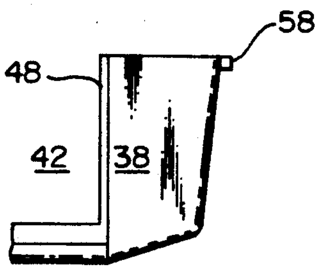
FIG. 6

SWITCH HOLDER FOR ALARM SYSTEMS

DESCRIPTION

1. Technical Field

The present invention relates to alarm safety switches used to reduce the risk of an alarm being accidently activated. More particularly, the invention relates to provision of a safety switch holder which is basically characterized by a pair of push button switches, each slidingly received at opposite ends of a cover which is in turn easily removable from a mounting base, allowing each switch to be rapidly wired and installed, repaired or interchanged with a new one.

2. Background of the Invention

In applications where reliability of a switch is of critical importance, ease of accessibility to quickly repair or replace the switch is desirable. The switches typically used to trigger a bank alarm system or turn on a camera e.g., at each teller station as well as other appropriate locations are an example of an application where replacement has to be made as quickly as possible. Generally speaking, the switches at the teller stations and elsewhere are always activated, i.e., they are always carrying an electrical current (active alarm system). If the current is interrupted, such as when a wire is cut or a switch fails, the alarm is activated. In the event that a switch fails and a false alarm is sounded, the entire alarm system is generally shut down until the faulty switch can be found and repaired or replaced. It is therefore desirable to have a switch holder which allows the switches to be repaired or replaced within a minimum amount of time.

The importance of providing a switch holder having the characteristics described above is that active alarm systems have an inherent problem. In an active alarm system, the contact points in switches have a tendency to oxidize more rapidly that if there was no current continuously flowing through them. This oxidation process is a leading cause of switch failure. Since switch life is very unpredictable, replacement of a failed switch is the most cost effective way to deal with the problem. It is known that the risk of false alarms can be reduced by using a pair of switches at each station. The pair of switches, which are usually of a push-button type, are placed diametrically opposite to each other within a single case or housing such that a person would normally have to use two digits to activate the alarm. In this manner, if one switch is accidentally pushed, the alarm will not sound. Further, since the switches are mounted out of sight, i.e. under a desk, it is appropriate that they be of as low profile and have a minimum of sharp edges or corners as possible.

DISCLOSURE OF THE INVENTION

A switch holder for mounting a switch is disclosed which includes a base and a cover. The Lase has a generally planar mounting surface permitting the base to be mounted to an appropriate surface and further includes a cover receiving surface. The cover receiving surface has a cover mounting means receiving portion and a switch positioning abutment member. The abutment member extends outwardly from the cover receiving surface and is positioned so as to contact and position the switch within the cover when the cover is secured to the base member. As indicated, the cover has a switch receiving opening in each end which are generally rectangular in shape with an open lower end for slidingly receiving the switch which is generally square in cross section. The cover include a plurality of side panels and a top panel. The cover further includes a mounting means by which it is connected to the base.

Preferably, the pair of switch receiving openings in the cover which are diametrically opposed to each other. The position of the switches is a safety feature, since both switches must be pushed in order to trigger an alarm, it is more reliable if they are physically separated.

In the preferred form, the cover is connected to the base by means of a plurality of tabs which are flexibly mounted to the cover and engage a equal number of holes in a ridge formed at, and extending upwardly from, a peripheral portion of the base.

For mounting the switch, a plurality of holes may be provided in the cover which are aligned with a plurality of mounting holes in the base. To provide proper distribution of the mounting forces, a fastener tube is provided which extends from the cover mounting holes to the base mounting holes.

Alternatively, once the switches are mounted within their housing, the housing could be taped to the supporting surface using any one of the several commercially available double sided tapes.

An opening in the base is provided for introducing wires to the switches. Alternatively, an opening may be provided in the ridge portion of the base and an opening in the cover aligned with the opening in the ridge may be used.

The prior art known to the present inventor utilizing a case for an electrical device which allows easy access for repair and inspection include U.S. Pat. No. 2,307,258, granted to W. A. DeSmidt et al., on Jan. 5, 1943 which discloses a housing into which the switch is mounted having a telescopic receiving cover which permits easy access.

U.S. Pat. No. 2,897,327, granted to W. A. DeSmidt et al. on Jan. 28, 1959 discloses essentially the same easy access cover structure.

U.S. Pat. No. 3,453,408 granted to C. Mune on Jul. 1, 1969 discloses snap in mounting system for placing circuit breakers into a panel.

U.S. Pat. No. 3,597,564 granted to Keith Lewis on Aug. 3, 1971 discloses a snap-on protective cover for protecting plunger type switches.

U.S. Pat. No. 3,723,689 granted to Lyle John Wenzel on Mar. 27, 1973 discloses a relay including a split housing to allow servicing U.S. Pat. No. 3,953,699 granted to Karl-Heinz Scheibel, et al. on Apr. 27, 1976 discloses an electric switching apparatus utilizing spring clips to hold the apparatus in place.

U.S. Pat. No. 4,163,882 granted to Floyd M. Baslow on Aug. 7, 1979 discloses a hinged adaptor or frame member wherein one side of the frame member is pivotally movable to a position allowing access to the electrical attachment screws.

With the above-noted prior art, and problems in mind it is an object of the present invention to provide a housing for a safety switch wherein the housing may be easily attached to a support member and also wherein the cover of the housing may be quickly and easily removed for replacement or repair of the switches mounted therein.

It is another object of the present invention to provide a switch receiving slot in a housing cover for a safety switch wherein the switches may be quickly and easily wired and installed, removed and/or replaced and wherein the base member for supporting the housing includes outwardly extending securement members holding the individual switches in position when the cover is mounted upon the base.

BRIEF DESCRIPTION OF THE DRAWINGS

In the drawings, like reference characters indicate like parts throughout the several drawings, unless otherwise indicated, and:

FIG. 1 is a perspective view of the inventive switch holder, taken from above and to one side, showing a base, a cover and one of a pair of switches;

FIG. 2 is a plan view of the base;

FIG. 3 is a sectional view of the base taken substantially along lines 3—3 of FIG. 2;

FIG. 4 is a bottom plan view of the cover with one switch shown in position;

FIG. 5 is a section view taken substantially along line 5—5 to FIG. 4; and

FIG. 6 is an enlarged fragmentary view taken substantially along lines 6—6 of FIG. 4.

BEST MODE FOR CARRYING OUT THE INVENTION

Referring first to FIG. 1, a switch holder 10 is shown to have a base 12, a cover 14, and a push-button style switch 16. While cover 14 is shown to be multi-sided, a simple four-sided arrangement could be used. The shown configuration is preferred, however, to limit sharp covers. Switch holder 10 may be molded from any suitable material, such as polycarbonate or the like. A pair of switches 16 is normally used, one being located at each end of cover 14.

Referring now to FIGS. 2 and 3, base 12 includes a cover receiving surface 18 and a mounting base 20. Mounting base 20 is generally planar allowing it to be mounted to any convenient flat surface, usually out of sight, at a teller's station. A pair of mounting screw holes 22 are provided for attaching base 12 to a hidden surface at the teller's station. Alternatively, the base could be taped to the surface. A boss 24 is provided around each hole 22 to reinforce the area around the hole. A pair of abutment members 26, each located at opposite ends of base 12, extend upwardly from receiving surface 18 for purposes to be described hereinafter. A set of four notches 28, hereinafter also referred to as cover mounting tab receiving openings, are located within a cover positioning ridge 30 (see FIGS. 1-3). Cover positioning ridge 30 is a raised portion of base 12 that is formed around the periphery of the base and extends upwardly therefrom a distance less than the height of abutment member 26. A wire opening or inspection hole 32 is provided in the center portion of base 12 to allow wires contained within a wall or the like to enter switch holder 10. It is to be understood that some installations require that twelve (12) wires be connected to the switches. As an alternate wire path, wire openings 34 are provided in ridge 30. Notches 28 may extend up into ridge 30, forming mounting tab openings 36.

Referring now to FIGS. 4-6, cover 14 is generally rectangular in shape and is formed from side panels 38 and a top panel 40. A switch receiving opening 42 is located in each end of cover 14. Switch opening 42 has three sides with the bottom being open and is preferably vertically oriented having a set-back wall 44 connecting it to side panel 38 via end panel 39. Switch opening 42 is sized to snugly receive a switch 46. A switch holding flange 48 provides a surface for switch 46 to be held against. A deformable flange 50 secured to switch 46 provides a slidable method of mounting switch 46 into opening 42. A wire access opening 52 is formed into cover 14 where it will coincide with opening 34 in base 12.

Cover 14 may be fastened to base 12 by using the same mounting fasteners used to mount the base 12 to mount both the base and the cover 14. The cover is provided with fastener openings 54 which are aligned with holes 22. A fastener tube 56 is formed integral with cover 14 and extends downwardly to a point which that when cover 14 is in contact with base 12 the tube is adjacent boss 24. When a fastener is placed through hole 54 in tube 56 and thereafter tightened, tube 56 contacts boss 24 and the mounting forces are transferred through tube 56 instead of through the cover's top panel 40 and side panels 38.

A second method of mounting cover 14 to base 12 uses a flexible tab system. Base 12 is mounted using fasteners acting directly on boss 56. A set of four mounting tabs 58 integral with a lower edge 60 near the corners of cover 14 are sized to engage tab receiving openings 36 of base 12. Lower edge 60 of cover 14 is sized to fit within the raised ridge 30 of base 12. This provides a more precise positioning of cover 14 and raises tab receiving opening above cover receiving surface 18. The side panels 38 to which tabs 58 are attached allow the tabs to be flexed sufficiently inward to allow them to pass by ridge 30 and then snap outwardly into openings 36. This method of mounting allows the cover to be removed quickly without the use of any tools.

OPERATION

In using the present invention, an appropriate location in a bank teller's station is selected to mount the switch holder 10. If the mounting fasteners are to be used only on base 12, the base is mounted with appropriate arrangement of the alarm wiring being installed. Next the switches 46 which have been wired are slid into switch receiving openings or slots 42. The switch 46 is prevented from moving axially by flanges 48, 50. Preferably, the wiring is completed prior to insertion. Once the switches 46 are mounted in the cover 14, the cover is mounted to base 12. Since the base 12 is already mounted, the cover 14 is fitted to the base by flexing side panels 38 inwardly allowing tabs 58 to pass by ridge 30 and snap outwardly into tab receiving openings 36 thereby snugly holding cover 14 in place. When cover 14 is in place, abutment members 26 contact their respective switches holding them in place and providing additional rigidity to each switch mount.

If it is desired to mount both the base 12 and the cover 14 at the same time by placing the fasteners through the fastener holes 54 in cover 14, the following procedure can be used. The switches 46 are slid into cover 14 as described above. The entire switch holder 10 is then placed on the desired mounting surface and the fasteners are directed through openings 54. This provides a more secure attachment of cover 14 to base 12, but requires an additional step to remove and replace a failed switch.

From the foregoing, further modifications, component modifications, component arrangement, and mode of utilization of the invention would be apparent to those skilled in the art which the invention is addressed.

The scope of protection is not to be limited by the details of embodiment which have been illustrated and described. Rather, the scope of protection to be determined by the claims interpreted in accordance with the established rules of patent claim interpretation including the doctrine of equivalents.

What is claimed is:

1. A switch holder for mounting a switch associated with an alarm system, said switch holder comprising:

a cover having a plurality of side panels and a top panel, a switch receiving opening located in one of said side panels, said switch receiving opening being generally rectangular in shape and having an open end opposite said top panel which that said opening slidingly receives said switch, said cover further including a mounting means for attachment of said cover; and a base having a generally planar mounting surface, a cover receiving surface, and a cover mounting means receiving portion, said cover receiving surface includes a switch positioning abutment member which extends upwardly from said cover receiving surface, whereby said switch is held in position within said receiving opening by said positioning abutment member when said cover is mounted to said base.

2. A switch holder according to claim 1, wherein said cover includes a pair of switch receiving openings which are diametrically opposed to each other in said cover and said base further includes a pair of said abutment members.

3. A switch holder according to claim 2, wherein said base further includes a raised peripheral ridge having said mounting means receiving portion included therein.

4. A switch holder according to claim 3, wherein said mounting means comprises a plurality of mounting tabs formed integral with a lower edge portion of said side panels, said tabs extending horizontally outwardly a distance such that they engage said mounting means receiving portion of said base, said mounting means receiving portion being a plurality of openings in said ridge, said sidewalls being sufficiently flexible to allow said tabs to pass by said ridge and engage said openings.

5. A switch holder according to claim 4 wherein said base includes at least one fastener hole, said fastener hole being reinforced by a boss which extends upwardly from said cover receiving surface.

6. A switch holder according to claim 5, wherein said base includes at least one opening for wiring.

7. A switch holder according to claim 5, wherein said cover includes at least one opening for wiring.

8. A switch holder according to claim 5, wherein said mounting means for attaching said cover to said base includes fastener openings in said top panel, said openings being aligned with said mounting hole in said base, said mounting means further including fastener tubes which extend downwardly from said top panel and, when mounted, said tubes engage said bosses such that any mounting forces are distributed through said tubes to said base.

9. A switch holder according to claim 1, wherein said plurality of side panels comprises a pair of elongated side wall and a pair of end walls, at least one of said end walls having a switch receiving opening formed therein with an open end located opposite said top panel, said switch receiving opening further including a switch holding flange adjacent said open end, said opening shaped to slidingly receive a switch.

10. A switch holder according to claim 9, wherein said base further includes a raised peripheral ridge having said mounting means receiving portion included therein.

11. A switch holder according to claim 10, wherein said mounting means comprises a plurality of mounting tabs formed integral with a lower edge portion of said side panels, said tabs extending horizontally outwardly a distance such that they engage said mounting means receiving portion of said base, said mounting means receiving portion being a plurality of openings in said ridge, said sidewalls being sufficiently flexible to allow said tabs to pass by said ridge and engage said openings.

12. A switch holder according to claim 11, wherein said base includes at least one fastener hole, said fastener hole being reinforced by a boss which extends upwardly from said cover receiving surface.

13. A switch holder according to claim 12, wherein said base includes at least one opening for wiring.

14. A switch holder according to claim 12, wherein said cover includes at least one opening for wiring.

15. A switch holder according to claim 12, wherein said mounting means for attaching said cover to said base includes fastener openings in said to panel, said openings being aligned with said mounting hole in said base, said mounting means further including fastener tubes which extend downwardly from said top panel and, when mounted, said tubes engage said bosses such that any mounting forces are distributed through said tubes to said base.

* * * * *